United States Patent [19]

Ikeda

[11] 4,334,273
[45] Jun. 8, 1982

[54] SIGNAL PROCESSING SYSTEM USING A DIGITAL TECHNIQUE

[75] Inventor: Yoshikazu Ikeda, Tama, Japan

[73] Assignee: Kokusai Denshin Denwa Co., Ltd., Tokyo, Japan

[21] Appl. No.: 140,449

[22] Filed: Apr. 17, 1980

[30] Foreign Application Priority Data

Apr. 24, 1979 [JP] Japan .................................. 54-49732
May 14, 1979 [JP] Japan .................................. 54-58109
May 19, 1979 [JP] Japan .................................. 54-61030

[51] Int. Cl.³ ..................... G01R 23/02; G06F 15/332
[52] U.S. Cl. ................................ 364/484; 179/84 VF;
307/522; 328/138; 364/726
[58] Field of Search ............... 364/484, 724, 726, 728;
179/84 VF; 307/233 R, 522; 328/138, 140;
324/78 R, 78 D

[56] References Cited

U.S. PATENT DOCUMENTS 3,824,471 7/1974 Mills .................................. 364/724 X
4,100,378 7/1978 Claasen et al. ................. 328/138 X
4,164,036 8/1979 Wax ............................. 179/84 VF X

OTHER PUBLICATIONS

I. Koval et al., "Digital MF Receiver Using Discrete Fourier Transform", *IEEE Trans. on Communications*, vol. COM-21, No. 12, 12-1973, pp. 1331-1335.

Primary Examiner—Jerry Smith
Attorney, Agent, or Firm—Armstrong, Nikaido, Marmelstein & Kubovcik

[57] ABSTRACT

An apparatus for detecting a tone signal in a telephone switching system is provided in which a calculation, in particular, multiplication is performed by a table look-up process in a digital memory, instead of using a conventional complicated multiplier. A tone signal of a particular frequency in a telephone line is detected through a discrete Fourier transform process (DFT), by the calculation of $s(i)=x(iT)\times\sin(i2\pi fT)$, $c(i)=x(iT)\times\cos(i2\pi fT)$, $S=\Sigma s(i)$, $C=\Sigma c(i)$, and $P=S^2+C^2$. In the above calculation, the multiplication ($x(iT)\times\sin(i2\pi fT)$, and $x(iT)\times\cos(i2\pi fT)$) is performed by a table look up method in a read only memory (ROM). Thus, the calculation is simplified. Further, the ROM has cells for only the discrete particular levels of multiplicands and/or the multipliers to reduce the capacity of the ROM, and the ROM is referred to by the multiplicand and/or the multiplier through the conversion of the same by a coefficient number generator.

6 Claims, 22 Drawing Figures

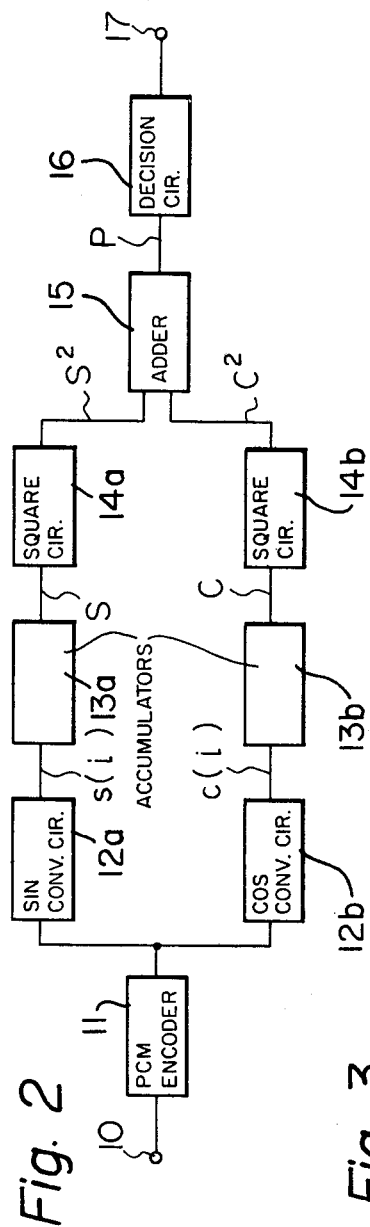
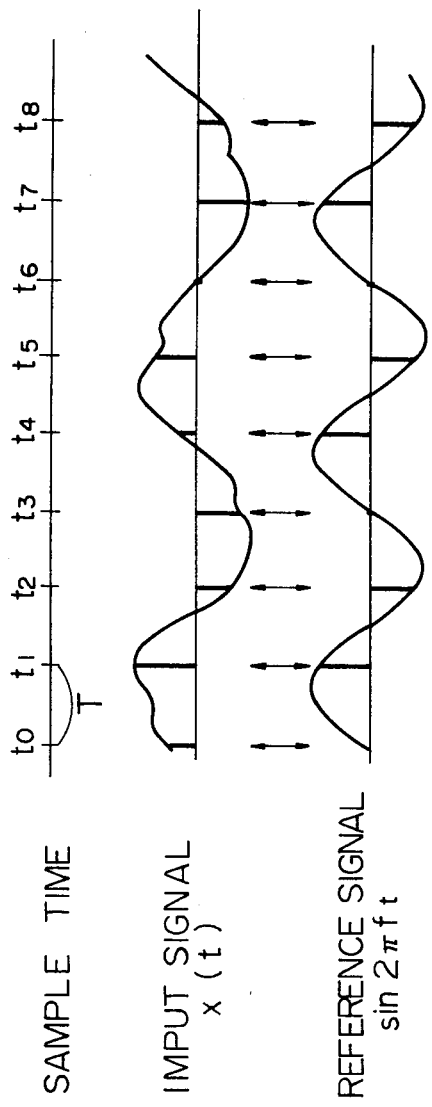
Fig. 2
Fig. 3

Fig. 20

| k' | j' | READ OUT ORDER OF COEFFICIENT NUMBER | |
|---|---|---|---|
| | | sin | cos |
| 0 | + 0 | | |
| 1 | + 7 | | |
| 2 | + 14 | | |
| 3 | + 19 | | |
| 4 | + 12 | | |
| 5 | + 5 | | |
| 6 | − 2 | | |
| 7 | − 9 | | |
| 8 | − 16 | | |
| 9 | − 17 | | |
| 10 | − 10 | | |
| 11 | − 3 | | |
| 12 | + 4 | | |
| 13 | + 11 | | |
| 14 | + 18 | | |
| 15 | + 15 | | |
| 16 | + 8 | | |
| 17 | + 1 | | |
| 18 | − 6 | | |
| 19 | − 13 | | |
| 20 | − 20 | | |

SIGNAL PROCESSING SYSTEM USING A DIGITAL TECHNIQUE

BACKGROUND OF THE INVENTION

The present invention relates to a signal processing system using a digital technique, and in particular, relates to a tone signal detecting system in a telephone switching system using a digital processing system.

A prior tone signal detecting system in a telephone switching system is based upon an analog circuit, and has many analog filters, and analog amplifiers. Accordingly, a prior tone signal detecting system is large in size, and since a multiplexed apparatus is impossible, the system has been uneconomical. Further, the regular maintenance is periodically necessary to keep the desirable characteristics of the apparatus, since an analog apparatus is deteriorated by the secular variation.

A prior digital technique for detecting a tone signal in a telephone switching system is a Discrete Fourier Transform (DFT), which samples the input signal in every predetermined period T (second) and provides the sampled values $x_0, x_1, x_2, x_3 \ldots$. The convolution operation is carried out between said sampled values and the sampled values of the reference signals having the frequency f (Hz), which is the same as the frequency to be detected. Thus, two series of products ($s_i = x_i \times \sin 2\pi f T_i$), and ($c_i = x_i \times \cos 2\pi f T_i$) are obtained. Those series are accumulated in a predetermined duration, respectively. Each of the accumulated values are squared, respectively, and the two squared values are added to each other. The sum of the addition is the spectrum component of the frequency f Hz of the input signal. If the input signal includes the frequency component other than the frequency f Hz, that component is deleted in the above calculation process. The DFT system is suitable for implementing by digital components since only the discrete sampled values of the input signal are utilized. In the case of the digital type exchange system, in particular, where the channel switch comprises the digital elements, because switching is done after all the telephone signals have been converted to digital code such as PCM, Discrete Fourier Transform (DFT) has good prospects of extensive use in the multi-frequency signal receiver installed in this type of exchange system.

FIG. 1 shows an embodiment of a conventional signal detection system using the above mentioned theorem. In FIG. 1, 1-6, representing $f_1-f_6$ respectively, form the DFT circuit that processes calculation of frequency components based on DFT. Initially, the input signal is to be input in the form of PCM code through the input terminal 8. This input signal is multiplied by the sample sequences, $\sin 2\pi f_1 t$ and $\cos 2\pi f_1 t$, by the internal block 1A of the DFT circuit 1. The block 1A comprises 2 multiplicators (circuit) and the code generator (or oscillator) of the sin sequence and cos sequence. The next block 1B comprises 2 adders and the memory for cumulative calculation that cumulatively calculate the results of the aforementioned process.

After the cumulative calculation has been made for a given number of periods, the result is transmitted to the block 1C where each one is squared and then both are added. The DFT circuit 2 also has an equivalent configuration to the above but the frequencies of sin and cos are established at $f_2$ (Hz). Similarly, by establishing a total of 6 DFT circuits by altering the frequency, each component of the 6 different frequencies may be obtained. The outputs of these DFT circuits are input into the decision circuit 7, which determines whether each frequency component has the prescribed level or not. From the result of this determining process, rationality of the combination of two different frequencies is examined. Thereafter, the numerical information embodied in that combination is obtained and is applied to the output terminal 9. When used as a telephone tone signal receiver, this final numerical information is transferred to the exchange control device of the telephone exchange system.

During the aforementioned conventional convolution operation, the blocks 1A and 1B must complete multiplication and addition within the period of the sampling interval (normally 125 $\mu$s) of the input PCM signal. The multiplier, in particular, has a complicated circuit configuration with a relatively slow operational speed because of the carry bit propagation, etc. Therefore, if the circuit configuration of the prior art was used employing time division and in order to have the many time-division-multiplexed PCM input signals operate properly, the operation speed of the multiplier in the initial level block 1A causes a bottle neck, and the number of multiplexes would be limited. This was the shortcoming of the prior art. In the prior art, the configuration is complicated with many expensive multipliers resulting in high prices and less reliability.

SUMMARY OF THE INVENTION

It is an object, therefore, of the present invention to overcome the disadvantages and limitations of a prior tone signal detecting system by providing a new and improved tone signal detecting system.

It is also an object of the present invention to provide a tone signal detecting system which performs the multiplication simply and quickly by looking up in a digital memory in a discrete Fourier transform process.

The above and other objects are attained by a signal detection system for detecting the particular frequency among the plurality of frequencies comprising an input terminal which receives said plurality of frequencies including the particular frequency, a pair of multipliers for performing the multiplication of the input signal and a pair of reference signals which are orthogonal to each other and have the period of the particular frequency to be detected, a pair of accumulators for accumulating each output of said multipliers, a pair of square circuits for providing the square of each output of said accumulators, an adder for providing the sum of the outputs of said square circuits, a decision circuit for comparing the output of said adder with the predetermined threshold value and detecting the particular frequency when the output of the adder is larger than the predetermined threshold value, an output terminal connected to the output of the decision circuit to providing the detected result of the particular frequency, said multiplier having a memory which stores the product of the sampled level of the input signal and the sampled level of the reference signal at the address which is defined by said sampled level of the input signal, and the multiplication being performed by looking up in the memory according to the sampled level and the sequence of the input signal and the coefficient number of the reference signal.

BRIEF DESCRIPTION OF THE DRAWINGS

The foregoing and other objects, features, and attendant advantages of the present invention will be appreciated as the same become better understood by means of the following description and accompanying drawings wherein;

FIG. 2 is the block diagram of the signal detection system according to the present invention, FIG. 3 shows the multiplication of the input signal and the reference signal, FIG. 20 is the explanatory drawing for the explanation of the operation of the apparatus of FIG. 19, FIG. 21, consisting of a-h, is the time chart for the explanation of the operation of the apparatus shown in FIG. 19, and FIG. 22, consisting of A-D, is the explanatory drawing for showing the generation of the table memory for the multiplication calculation.

DESCRIPTION OF THE PREFERRED EMBODIMENTS

Figure 1:
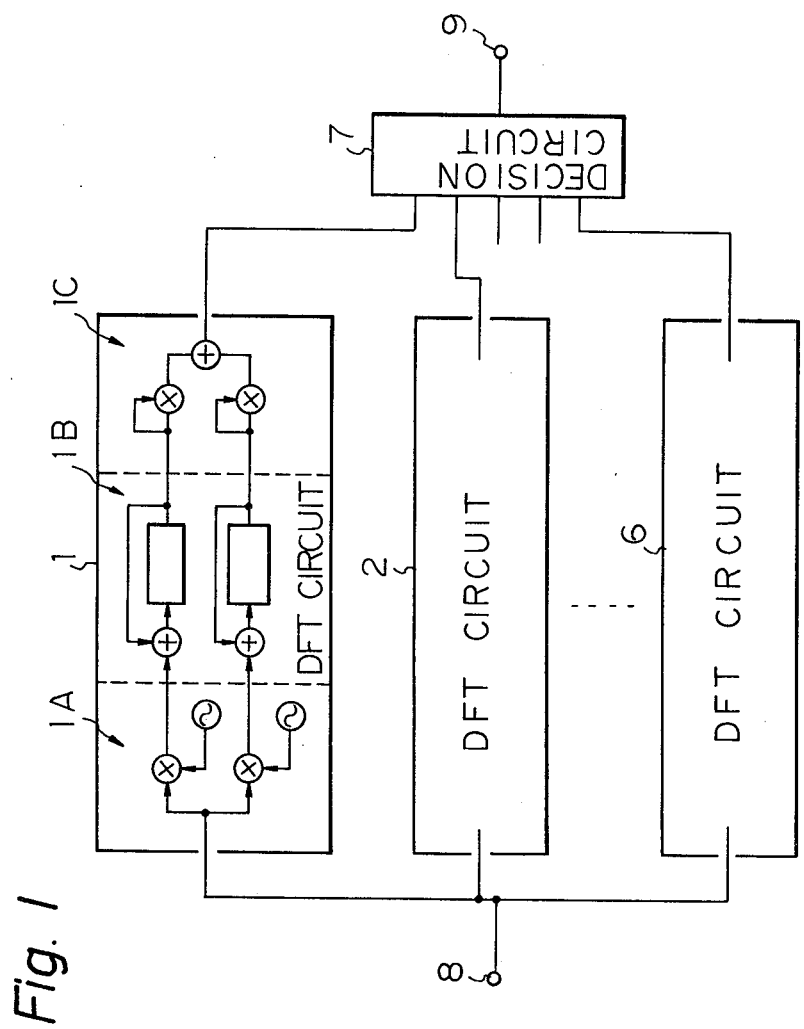
FIG. 1 is a block diagram of the prior DFT circuit.

FIG. 2 is the block diagram of the first embodiment of the present signal detection system. In the figure, the reference numeral 10 is a signal input terminal, 11 is a PCM encoder, 12a is a sin component conversion circuit, 12b is a cos component conversion circuit, 13a and 13b are accumulators, 14a and 14b are square circuits, 15 is an adder, 16 is a decision circuit, and 17 is an output terminal of the detected signal. The signal input terminal 10 is to be connected to an external communication line in a telephone exchange system. The apparatus of FIG. 2 functions to detect if the particular frequency component with the level higher than the predetermined threshold level exist in the input signal, and to inform the detected result to the exchange system. That particular frequency component is a tone signal for the control of the telephone exchange system.

An analog signal applied to the input terminal 10 is converted to a digital form by the conventional PCM encoder 11. The PCM code in this case is the so-called $\mu$-law signal with the sampling period 125 $\mu$S. When a telephone exchange system is a digital exchange system, the signal applied to the input terminal 10 is of course in a digital form, so the encoder 11 can be deleted.

The PCM signal thus encoded is applied to the circuits 12a and 12b, which calculates the sin component and the cos component of the frequency to be detected, respectively. That is to say, assuming that the input signal is $x(nT)$, where $T = 125$ $\mu$S which is the sampling period, and n is an integer ($n = 1, 2, 3 \ldots$), the outputs $s(i)$ and $c(i)$ of the circuits 12a and 12b are shown below. The structure of those circuits will be described later.

$$s(i) = x(iT) \times \sin(i2\pi fT)$$

$$c(i) = x(iT) \times \cos(i2\pi fT)$$

The calculation in the circuits 12a and 12b is performed every time the sample of the input signal is applied, and accumulated by the circuits 13a and 13b of the next stage for a limited time (NXT), respectively. This is a circuitry called an accumulator and is obvious to those skilled in the art. Accordingly, the outputs are as follows.

$$S = \sum_{i=D}^{N-1} s(i)$$

$$C = \sum_{i=D}^{N-1} c(i)$$

Further, the both outputs are squared by themselves, respectively, by the square circuit (the realization method thereof will be described later), and then, summed up by the summing circuit which can be realized readily by a conventional digital technique. That is to say, the output P from the summing circuit 15 is $P = S^2 + C^2$. During the aforesaid process, the frequency components of the input signal excepting the predetermined f are cancelled with each other and subjected to the great attenuation, so that P becomes a value proportional to the f component.

Although the present embodiment is described utilizing sin and cos as reference waves, more generally any two kinds of orthogonal functions can be substituted for said sin and cos. The sin and cos in the present invention is one example.

The principle of DFT can prove aforesaid operation.

The deciding circuit 16 is utilized for deciding whether the f component in the input signal is in the predetermined level range. The output of the summing circuit 15 is applied to the circuit 16 which compares it with the predetermined values of the upper and lower limits. And only when it is within the both limits, the output signal which shows the reception of the specific tone is applied to the signal detection output terminal 17. Accordingly, the deciding circuit 16 can be realized readily by the conventional technique.

The sin component converter circuit 12a is constituted as follows. FIG. 3 is the explanatory diagram showing the multiplication relationship between the input signal x(t) and the reference wave sin 2πft. The input signal has sampled at regular intervals during the PCM coder process. In order to give the product of the input signal by the reference wave at each sampling time, the conventional and well known system multiplies the both values by the multiplier circuit. However, the circuit according to the conventional system requires the complicated and expensive construction. According to the present embodiment, a multiplication table is previously prepared utilizing a ROM, and the circuit is constituted for practically providing the output equivalent to said operations referring to the table.

Supposing that, for example, the sampling interval = 125 μS, and the detecting frequency f = 2666.7 Hz, there appears three values sin O, sin $(\frac{2}{3})\pi$, and sin $(4/3)\pi$ repeatedly as the sampled values of the reference wave. On the other hand, the input signal is digitized, and when it is coded by 8 bits, for example, $2^8 = 256$ values in all are provided, then, excepting the positive and negative polarities, there remains 128 amplitude values for the absolute value. Accordingly, among the multiplications of the input signal by the reference wave, only 3×128 patterns are possible combinations for practical use. Further, since sin O=0, multiplications by sin O become wholly O, thus 2×128 combinations are practically possible.

Figure 4:
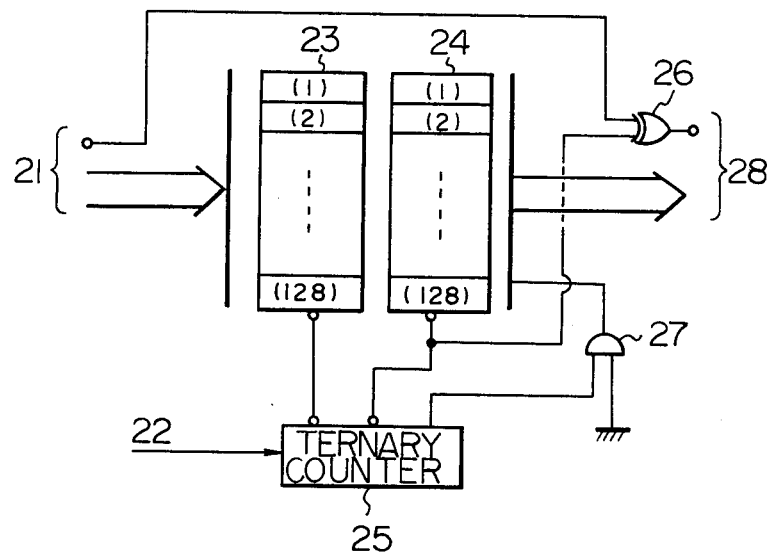
FIG. 4 is the block diagram of the sin component conversion circuit.

FIG. 4 is the block diagram showing the example for realizing the sin component converter circuit 12a. The PCM modulated input signals are applied from input lines 21 in parallel. Simultaneously, a timing of a sampled time is also applied to a ternary counter 25 from 22. Memories 23 and 24 comprising ROMs have 128 words respectively, and each word is addressed by 7 bits which are the amplitude indication bits excepted the polar bit from the input signal. Further, the addressed word is indicated its portion 23 or 24 by the output of the ternary counter 25. In each memory 23 or 24, the word which is at the position to be addressed by the amplitude bits of the input signal, has previously stored the calculated value of (input amplitude value)×(sin $(\frac{2}{3})\pi$) or (input amplitude value)×(sin $(4/3)\pi$). Namely, this is the multiplication table. The ternary counter 25 designates one of these two tables.

At the sampling timing $t_0$, the ternary counter 25 opens a gate 27 so that output values at 28 become all O, that is to say, it is equal to multiply the input values by sin O=0. Next at the timing $t_1$, since the multiplication table in the memory 23 is designated, the input signal reads out the predetermined result referring to the memory 23, and applies it to the output 28. At the time, the polar bit passes through an EX-OR gate 26 ("exclusive or" circuit), but it suffers no variation of the value. That is to say, the multiplication by sin $(\frac{2}{3})\pi$ (a positive integer) is performed. Then, at the timing $t_2$, the memory 24 is designated, the polar bit is inverted at the gate 26, this means the multiplication by sin $(4/3)\pi$ (a negative integer) is performed. Since sin $(4/3)\pi = -\sin (\frac{2}{3})\pi$ casually in this case, the absolute values of the both coefficients are equal, and both contents are the same, so that one memory can double the other. Thus the number of the memory required is decreased furthermore.

The realization method for the cos component converter circuit 12b is the same as that of said circuit 12a excepting that the sampled values of the reference wave are cos O=1, cos $(\frac{2}{3})\pi$, cos $(4/3)\pi$ = cos $(\frac{2}{3})\pi$, respectively. Accordingly, the circuit 12b can be realized in the same manner as the circuit 12a excepting that the memory contents of ROMs should be changed, and that the inverse operation of the polar bit is not necessary. Further, the ternary counter in FIG. 3 can be commonly used by the circuits 12a and 12b. Besides, it can be realized readily that the memory for sin and the memory for cos are stored in the different areas within the same memory chip, and its operation is carried out by switching them by the time.

Generally, when the multiplication is performed by a digital operational circuit, a code format of an input PCM signal must be a linear code. In PCM systems for transmission, however, non-linear codes by companding encoding are generally used. Accordingly, when a signal is operated by a prior operational circuit, a pre-circuit is needed for converting the input companding code into the linear code. According to the present invention, the input PCM signal is used for accessing the memory, so that it is not necessary to convert the input code into the linear and the code conversion circuit is not required.

The process for preparing codes which are written in the memory 23 in FIG. 4 beforehand is as follows. Supposing that the companding law of the input PCM signal is μ-law, the relationship between the codes of 7 bits excluding the polar bit and the original analog values are defined by C.C.I.T.T. recommendation G. 711. For example, a PCM code "0000000" corresponds to an analog value 8031, and "0000001" corresponds to 7775. On the other hand, since sin $(\frac{2}{3})\pi$ of the coefficient is equal to 0.8660, the multiplication of the code "0000000" by sin $(\frac{2}{3})\pi$ is 8031×0.8660=6954.8 in the analog value. In order to perform the summing operation of the following stage, this analog value is converted, for example, into the linear PCM code of 13 bits, then, $X_o$ = "1101100101011" is given as result. Similarly, 7775×0.8660=6733.2 is given for the code "0000001", and an analog value of which is the linear code $X_1$ = "1101001001101". Accordingly, $X_o$ should be written in the work in the memory 23, which is addressed by the input code "0000000", and $X_1$ should be written in the word addressed by "0000001". All other input codes are calculated in the same manner for obtaining the codes to be written in.

Figure 5:
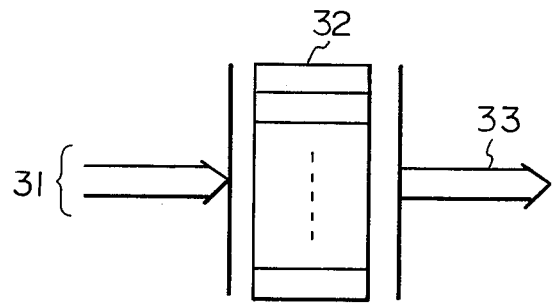
FIG. 5 is the block diagram of the square circuit.

Next, the square converter circuits 14a and 14b will be described. FIG. 5 shows the constitution example of the square converter circuit 14a comprising an input signal terminal 31, a read only memory (ROM) 32, and an output signal terminal 33. The function of the circuit is to input a digital signal Di which corresponds to an analog value a, and to output a digital signal Do which corresponds to an analog value $a^2$. Accordingly, the signal Di applied from the input signal terminal 31 is regarded as an address, and is given access to the specific work of the memory 32. At the position, the digital signal $D_o$ which corresponds to the analog value $a^2$ and was previously calculated at the designing time, has written in. That is to say, words equivalent to whole pattern numbers of the input signal have provided beforehand in the memory 32, in which a previously calculated square table has stored. Accordingly, since there exists the predetermined square signal $D_o$ at the position where is gained access by $D_i$, the expected function can be performed by reading out and applying it. The above mentioned access and read operation by the address can be realized readily by those skilled in the art utilizing conventional memory elements. By the way, in the case that the bit number in one word of the input signal is n bits, the number of memory words required in $2^n$. Accordingly, when n is large, the polarity of the input signal never affects the square operational results, therefor it can be removed so as to decrease one bit. Concretely, in the case that the coding scheme of the input signal is the polar bit + amplitude system, merely the polar bit ought to be omitted. In the case that the coding scheme is the compliment, the input signal ought to pass through the prior compliment generator circuit only when it is a negative quantity. Further, less significant bits of the input signal can be omitted so that the number of the memory required can be decreased. Although errors in the operational results are increased in this case, the function which does not matter in practical application can be achieved by applying superior 8 to 12 bits.

Since the square converter circuit 14b has the equal construction as that of the said circuit 14a, and the contents of the memories are also the same with each other, it is possible that only one circuit is provided for the time-sharing multiplexing by switching it time-wisely.

By the way, as a similar realization method, an alternative for the square converter circuit is possible by a circuit to generate merely absolute values. In this case, the resultant characteristics of the tone detection deteriorates slightly, but it can be utilized when it gives the satisfaction to the detection standard. The above mentioned circuit for generating absolute values can be realized readily by removing the polar bit or by the compliment generator circuit, utilizing the prior technique.

Figure 6:
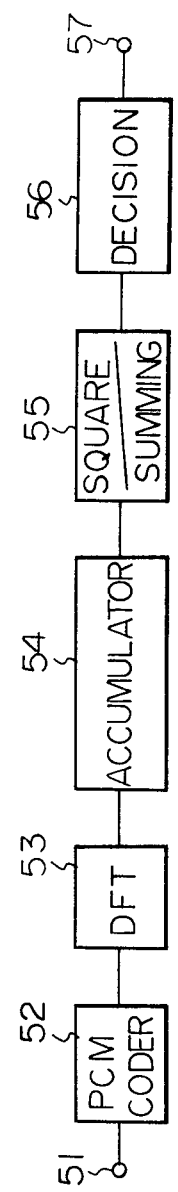
FIG. 6 is the block diagram of the second embodiment of the present signal detection system.

FIG. 6 is the block diagram showing the second embodiment, and this is the case to detect line signals of No. 5 signal system for a telephone exchange of C.C.I.T.T. recommendation. In this application, tone signal frequencies to be detected are two, namely, $f_1 = 2400$ Hz, and $f_2 = 2600$ Hz. Some cases are considered in receiving said frequencies, one is the case that either frequency $f_1$ or $f_2$ is received separately, and the other is the case that both frequencies are received simultaneously. Besides, there is still other case that both frequencies do not exist. The embodiment of FIG. 6 discriminates the above mentioned four cases in total and transmits control informations for the telephone exchange.

In FIG. 6, the reference numeral 51 is an analog input signal terminal, 52 is a PCM coder circuit, 53 is a DFT converter circuit, 54 is an accumulator circuit, 55 is a square converter and summing circuit, 56 is a deciding circuit, and 57 is a signal detection output terminal.

A signal branched from a communication line housed within the exchange is applied to the input signal terminal 51. The PCM coder circuit 52 which can be constructed by the prior technique converts the analog input signal into a PCM signal. The PCM coder circuit may be provided individually for every analog input, and it may as well be provided solely for the time-sharing multiplexing so that more analog inputs can be converted into PCM codes consentratively. Both methods are conventional and obvious to those skilled in the art. When the input terminal is applied with a signal which is already PCM modulated, the PCM coder circuit can be removed as described previously for the first embodiment. The DFT converter circuit 53 performs equivalent processes to the multiplications of the input signal by both coefficients of sin and cos of the detecting frequencies $f_1$ and $f_2$, utilizing ROM.

Figure 7:
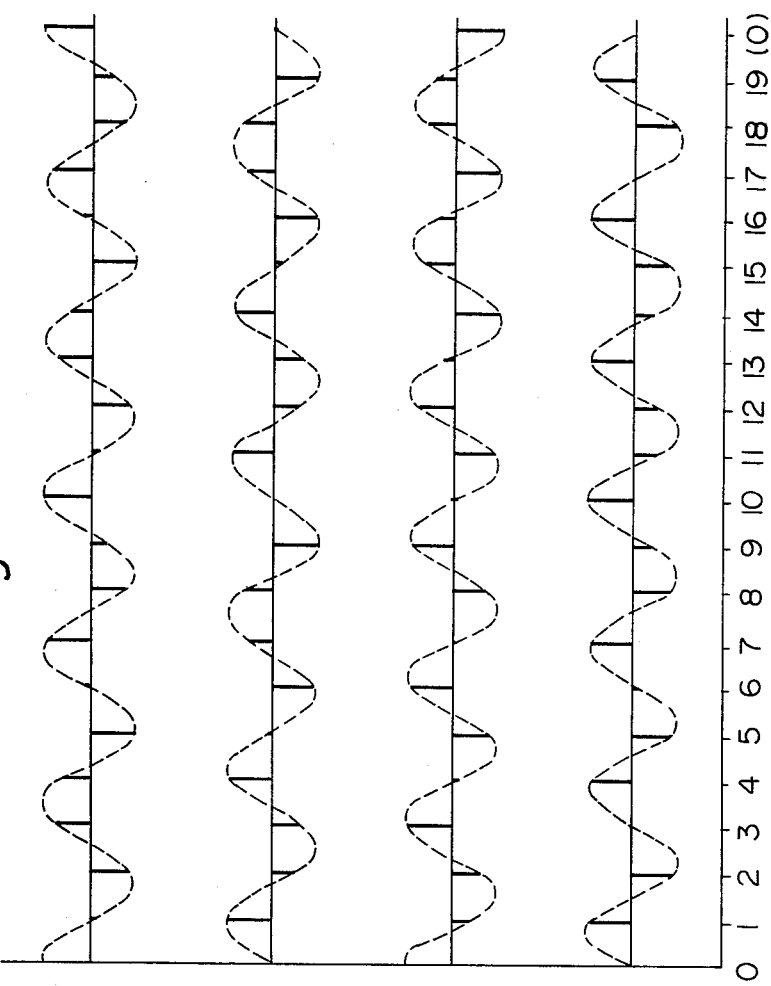
FIG. 7 shows the explanatory drawing for showing the cos waveform and the sin waveform of $f_1$ signal (2400 Hz), and $f_2$ signal (2600 Hz)

FIG. 7 is the explanatory diagram showing sampled values, wherein cos and sin waveforms of $f_1 = 2400$ Hz, and $f_2 = 2600$ Hz are sampled at $T = 125$ μS. These sampled values become coefficients to be multiplicated to the input signal. Here, taking the periodicity of the waveform into consideration, coefficient values required are limited to 11 kinds as shown in Table 1.

$$C_i = \cos\frac{13}{20} i\pi, \quad i = 0,1,2,\ldots,10$$

Particulary, since $C_0 = 1.0$, and $C_{10} = 0.0$, 9 kinds are practically effective for the coefficients of the multiplications.

TABLE 1

| Sample Number | $f_1$ (2400 Hz) cos | $f_1$ (2400 Hz) sin | $f_2$ (2600 Hz) cos | $f_2$ (2600 Hz) sin |
|---|---|---|---|---|
| 0 | $C_0$ | $C_{10}$ | $C_0$ | $C_{10}$ |
| 1 | $C_4$ | $C_6$ | $C_1$ | $C_9$ |
| 2 | $C_8$ | $C_2$ | $C_2$ | $C_8$ |
| 3 | $-C_8$ | $C_2$ | $C_3$ | $C_7$ |
| 4 | $-C_4$ | $C_6$ | $C_4$ | $C_6$ |
| 5 | $-C_0$ | $C_{10}$ | $C_5$ | $C_5$ |
| 6 | $-C_4$ | $-C_6$ | $C_6$ | $C_4$ |
| 7 | $-C_8$ | $-C_2$ | $C_7$ | $C_3$ |
| 8 | $C_8$ | $-C_2$ | $C_8$ | $C_2$ |
| 9 | $C_4$ | $-C_6$ | $C_9$ | $C_1$ |
| 10 | (Sample numbers | | $C_{10}$ | $C_0$ |
| 11 | D-9 are repeated | | $-C_9$ | $C_1$ |
| 12 | hereinafter.) | | $-C_8$ | $C_2$ |
| 13 | | | $-C_7$ | $C_3$ |
| 14 | | | $-C_6$ | $C_4$ |
| 15 | | | $-C_5$ | $C_5$ |
| 16 | | | $-C_4$ | $C_6$ |
| 17 | | | $-C_3$ | $C_7$ |
| 18 | | | $-C_2$ | $C_8$ |
| 19 | | | $-C_1$ | $C_9$ |

(To be repeated hereinafter)

Figure 8:
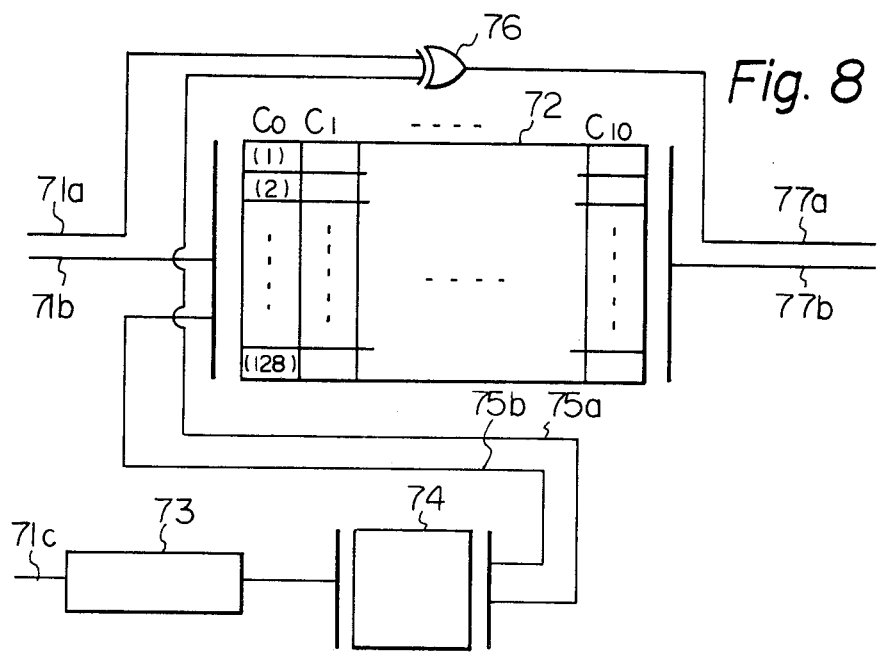
FIG. 8 shows the block diagram of the DFT conversion circuit according to the present invention.

On the other hand, since the input signals are subjected to quantization, in the case of 8 bits codes, for example, there remains only $2^7 = 128$ levels excepting positive and negative polarities. Accordingly, the DFT converter circuit 53 comprises ROM in which all multiplication results of the input signal by the coefficients $C_i$ are stored in the table form beforehand. FIG. 8 shows the example of the DFT converter circuit comprising read only memories (ROM) 72 and 74, a counter 73, and an EX-OR circuit 76.

The input PCM signal is applied from input terminals 71a and 71b. 71a is the input terminal for the polar bit, and 71b is for amplitude bits of 7 bits. A clock input terminal 71c is applied, simultaneously with the PCM sample timing, with 4 times as many as clocks thereat. The counter 73 is the counting circuit by the prior technique, which has the function to return after it has counted 80 clocks. The ROM 74 comprises the memory of 80 words, each word of which comprises one bit for indicating the inverse operation of the polarity, and 4 bits for indicating one of 11 segments of the ROM 72, and outputs thereof are applied through output leads 75a, and 75b, respectively. The 11 segments of the ROM 72 have stored the multiplication tables which correspond to the coefficient values $C_0, C_1, \ldots C_9, C_{10}$, respectively. And, according to the PCM signal applied from the input terminal 71b, one word in each segment is addressed. The code which has stored at the position addressed (which corresponds to the value multiplying the value displayed by the input signal by the coefficient $C_i$) is applied from the output terminal 77b. The order designating the segments is as follows. First, 4 coefficients in the first line of Table 1 are designated successively, then, at the next sample timing, coefficients in the second line are designated successively. If the ROM 74 has stored the segment numbers previously in this order, the ROM 74 is addressed cyclically by the counter 73 so that the multiplication tables stored in the ROM 72 are selected correctly according to the designated coefficient values. On the other hand, the polar bit of the input signal is applied to the EX-OR circuit 76, and the inverse operation indicating bit which is read out by the ROM 74 is also applied to the circuit 76 through the signal line 75a, so that the polarity is inversed and applied to the output terminal 77a only when the coefficient value $C_i$ is negative.

Although, in order to simplify the description, the above description has not taken the time-sharing multiplexing into consideration, the present construction can be readily applicable to the time-sharing multiplexing usage. That is to say, when n channels are multiplexed and applied to, a number n of PCM signals are applied successively over the same sampling interval (T=125 $\mu$S). In this case, the clock input 71c is applied with 4 times as many clocks as that of the channel timing, and with a frame timing for every 125 $\mu$S. The counter 73 comprises two counter groups, one of which is a 4-adic counter which counts 4 times channel clocks, and the other is a 20-adic counter which counts frame clocks, and both outputs of them are combined and utilized for the address signal of the ROM 74. According to this system, 4 coefficient multiplication results of cos and sin of $f_1$, and cos and sin of $f_2$, are applied to the output terminal in time series for every channel.

Besides, since $C_{10}=0$, multiplication results become always 0 to all input signal values, and so, all words in the segment corresponding to $C_{10}$ in the ROM 72 store 0 values. Accordingly, this portion can be removed so that the memory contents of the ROM 72 are further decreased, by providing an additional circuit connected to the output terminal 77b in order to apply 0 code when this segment is addressed.

Figure 9:
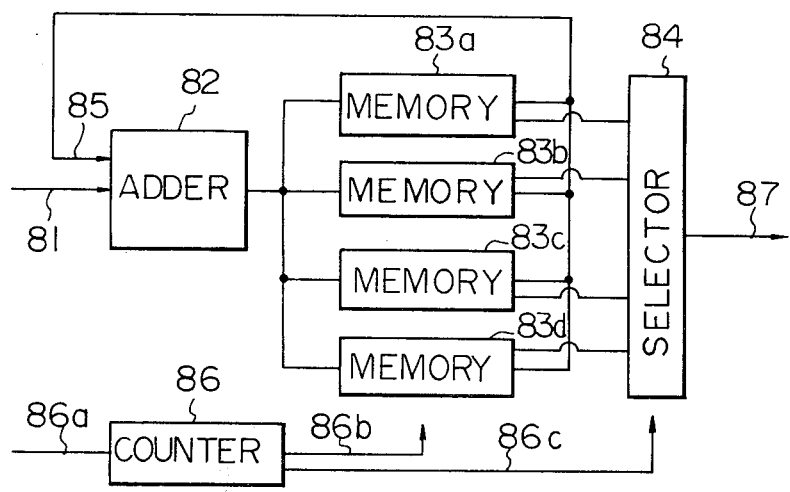
FIG. 9 is the block diagram of the accumulation circuit according to the present invention.

FIG. 9 is the block diagram showing the construction method of the accumulator circuit 54. The accumulator circuit 54 comprises a summing circuit 82, memories 83a, 83b, 83c, and 83d, a selector 84, and a counter circuit 86. The circuit 54 is applied with the output of the DFT converter circuit 53 through an input terminal 81, and accumulates sin and cos components of $f_1$ and $f_2$ for a limited period (for example, 20 mS), respectively. The signal from the input terminal 81 repeats for each sampling in the order of cos of $f_1$, sin of $f_1$, cos of $f_2$, and sin of $f_2$. The counter circuit 86 is applied with ¼ clocks as that of the sampling period through a clock terminal 86a, counts the number of clocks by the 4-adic counter, and enables the 4 memories 83a through 83d to operate cyclically and successively through an address line 86b. The counter circuit 86 is also provided with a 160-adic counter for taking the memory contents out by the selector 84 every time the 4 memories have operated 160 times. And the circuit 86 resets the memory contents, which have already read out, for next multiplication period.

The summing circuit 82 further adds the input signal to the contents of the memories 83a through 83d in which the previous multiplication values have stored. Accordingly, the 4 memories are provided with 160 times accumulated results of cos and sin of $f_1$ and $f_2$, respectively. Since the sampling period of the input signal is assumed 125 $\mu$S, each said 160 times accumulation corresponds to 160×125 $\mu$S=20 mS. The results of these accumulations are applied from the output terminal 87 to the next stage successively in time series through the selector 84.

Figure 10:
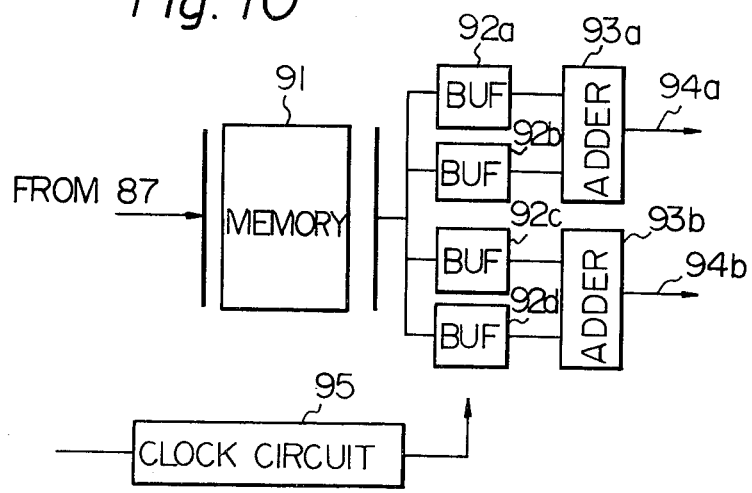
FIG. 10 is the block diagram of the square circuit and the adder according to the present invention.

FIG. 10 shows the construction of the square converter and summing circuit 56. The circuit comprises a memory for square convertion 91, buffer memories 92a, 92b, 92c, and 92d, adders 93a, and 93b, and a clock circuit 95. The memory for square convertion 91 is the same as the square converter circuit of the first embodiment (FIG. 5). According to the input timing, the outputs of the memory 91 can be classified into 4 groups, that is, a cos relation of $f_1$, a sin relation of $f_1$, a cos relation of $f_2$, and a sin relation of $f_2$, respectively. And these 4 groups are stored in the buffer memories 92a through 92d for a time. The clock circuit 95 comprises a 4-adic counter for designating the buffer memories, and are enabled to operate simultaneously with the timing pulse of the pre-stage. The summing circuits 93a and 93b sum up signals of 2 groups relating to $f_1$ and $f_2$, respectively, so that the results of $(\cos)^2+(\sin)^2$ relating to $f_1$ are provided to the output terminal 94a, and the results of $(\cos)^2+(\sin)^2$ relating to $f_2$ are provided to the 94b.

Figure 11:
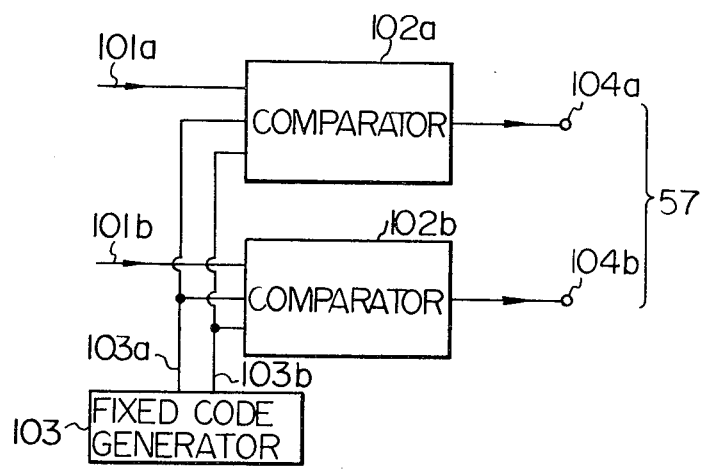
FIG. 11 is the block diagram of the decision circuit according to the present invention.

FIG. 11 shows the construction example of the deciding circuit 55. The circuit comprises comparators 102a and 102b, and a fixed code generator circuit 103. Input terminals 101a and 101b are connected to the output terminals 94a and 94b in FIG. 9, respectively. The fixed code generator circuit 103 has previously applied with the signal values after the DFT process relating to the upper and lower limits of the predetermined level range of the tone signal to be detected, so that the circuit 103 fixedly generates the codes of the 2 threshold values and applies them to the terminals 103a and 103b. The comparator 102a confirms whether the signal applied from the input terminal 101a is within the 2 threshold values provided by 103a and 103b. And when the signal is within the 2 values, the comparator 102a indicates that the tone signal $f_1$ is detected to the output terminal 104a. The comparator 102b also indicates the detection of $f_2$ to the output terminal 104b in the same manner. When $f_1$ and $f_2$ are applied simultaneously, the indications of the detection are given to both output terminals 104a and 104b. In the present construction, the comparators 102a and 102b, and the fixed code generator circuit 103 are conventional and obvious to those skilled in the art. By the way, in the provided range of the tone signal, when there is no need for setting the upper limit of the level according to the conditions required for the design, the comparators 102a and 102b can be circuits performing the comparison with the lower limit only.

Next, another embodiment of the present invention will be described in accordance with FIG. 12.

Figure 12:
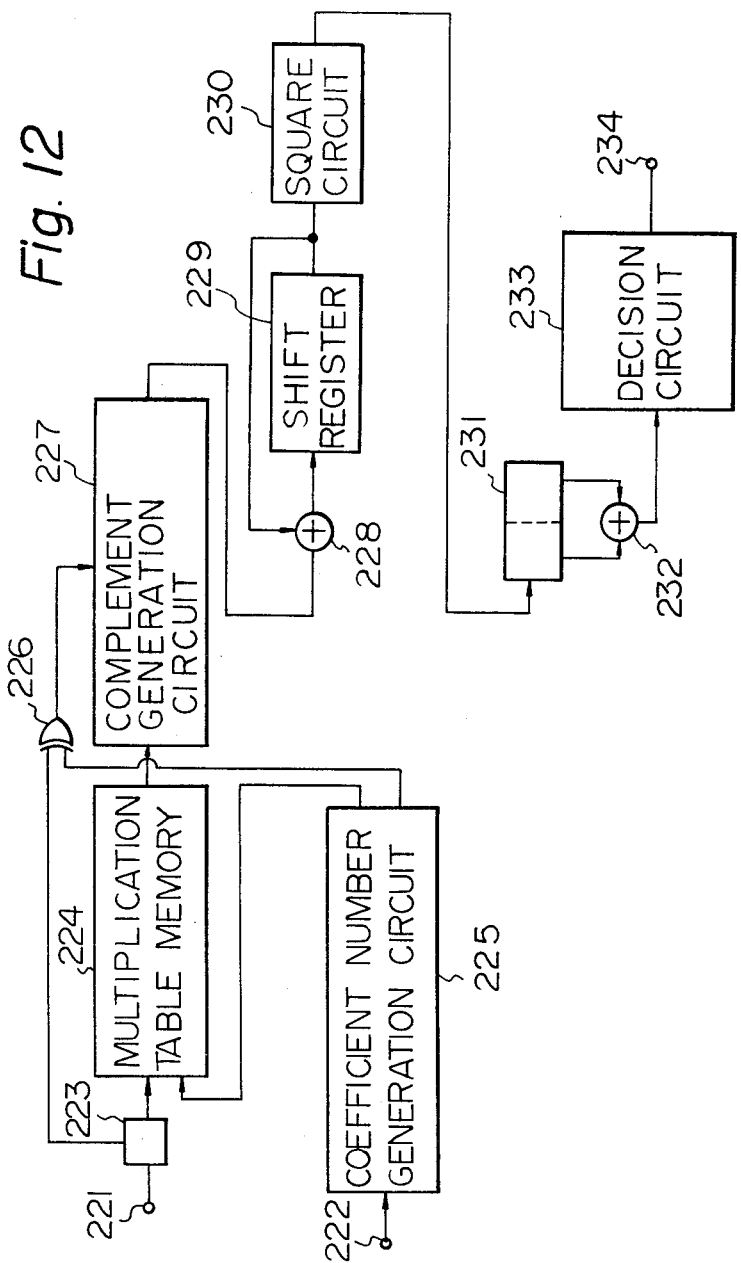
FIG. 12 is the block diagram of another embodiment of the signal detection system according to the present invention.

FIG. 12 illustrates an embodiment of the present invention. Time division multiplexed PCM signal is to be input from the input terminal 221. Frame pulse and channel pulse synchronized with input PCM signal are supplied to the clock terminal 222. The form of the input PCM shall be such that one frame is of 125 $\mu$S (same as the sampling interval). The channel time slot of the compressed and expanded (companded) 8 bit code shall be 32 channel multiplexed. The polarity separation circuit 223 comprises the gate circuit and the serial-parallel conversion circuit, and branches out only the polarity bit (the first bit) of each channel and transfer it to the exclusive −OR circuit. Among the remaining absolute value amplitude bits, 6 bits, excluding the least significant bit, are supplied to the multiplication table memory 224 as part of address. The coefficient number generation circuit 225, synchronizing with frame pulse and channel pulse, outputs signals designating segment of the memory 224 (memory circuit), and at the same time, outputs polarity signal to transfer to 226.

Figure 13:
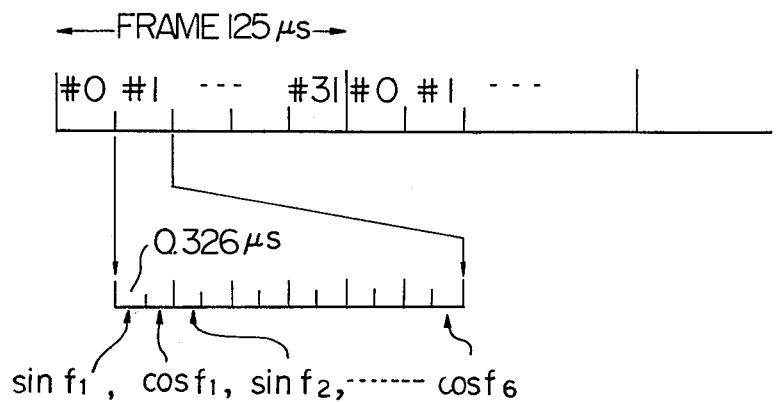
FIG. 13 shows the time-chart for showing the operation of the apparatus in FIG. 12.
Figure 14:
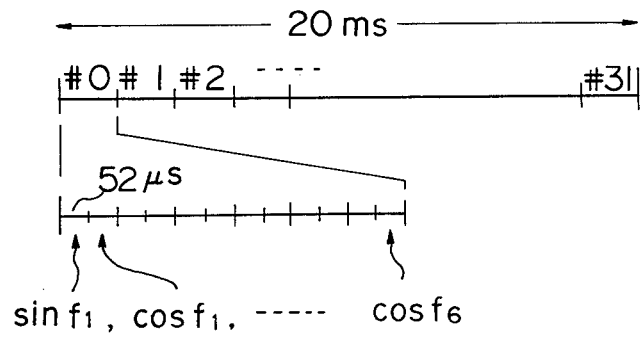
FIG. 14 shows the time chart of the accumulated time.

FIG. 13 illustrates a time chart showing a frame configuration of input PCM signal, wherein one unit of channel time slot (#0, #1, . . . ) is divided into 12 sub-time slot of 0.326 $\mu$S, and the coefficient number generation circuit 225 generates renewed output for each of the divided time slot. Each of these 12 sub-time slots is used for coefficient operation of sin and cos of 6 detected frequencies. The memory 224 consists of ROM and stores, in a prescribed segment and address, the code pattern formed by the method to be described later. As a result, the code which is read out using the input PCM signal and the output of the circuit 225 as address, becomes equal to the absolute value of the product of the samples of input signal and those of trigonometric function wave of the prescribed frequency. At the same time, multiplication process of the polarity is done through the exclusive logical sum circuit (exclusive-or circuit), and the result is used as "enable" (instruction for operation/non-operation) of the complement generation circuit 227. That is, if the polarity after the multiplication is negative, the complement generation circuit 227 generates complement of output code of the memory 224. But, if the polarity is positive, it will let it pass. 228 is the adder. 229 is the shift register of 32×12 words making one round for each frame. These two devices form the accumulator. That is, the signals to be input in this accumulator amount to 32 time slots for one frame, and since each time slot consists of 12 sub-time slots, cumulative calculation for a period of a prescribed number of frames on each of the total time slots of 32×12 will be done separately. When the cumulative calculation period is over, the result is transferred to the square circuit of the next step. At the same time, in order to prepare for the subsequent cumulative calculation, the part of the shift register for this operation is reset. Output from the accumulator can be had every accumulation time (e.g. 20 mS) with a lag of every one sub-time slot, avoiding coinciding of the timing. That is, as depicted in FIG. 14 a multiplex configuration shall be arranged. The multiplicator 230 can be realized by the multiplicator or by table look-up of the memory wherein square code conversion table has been stored, and outputs code corresponding to the square of the input. 231 is a 2 step shift register that accumulates two each of the time slot signals matching sin and cos of the same frequencies. The adder 232 makes addition of the two. As a result, the value of each frequency component of each channel is output in sequence from the adder 232. Therefore, the decision circuit 233 compares the results of these operations with the predetermined threshold level. In case 2 units of frequencies have been detected simultaneously, they are output as numerical information in accordance with the combination pattern through the output terminal 234 to outside.

The multiplication table memory 224 and the coefficient number generation circuit 225 which form the main framework of the present invention are to be arranged with the following configuration. Function of this part is to output the product obtained by multiplying input signal by coefficients being the samples of the sine wave and cosine wave having the prescribed 6 different types of frequencies.

The present invention attempts to realize this process through table look-up of the multiplication table prepared beforehand and not by the use of the multiplcator. In this case, if the size of the multiplication table becomes enormous it will not have economic effects. But if the table look-up method is orderly arranged it is indicative that a very small scale table can realize this process. The input PCM code excluding polarity has 7 bits. Further, the least significant bit can be ignored if practical precision is considered. Therefore, the quantizing level of the input signal becomes $2^6=64$. At the same time, the coefficients are sin $2\pi f_i Tk$ and cos $2\pi f_i Tk$ ($f_i=700, 900, 1,100, 1,300, 1,500, 1,700$ Hz totalling 6; T=sampling interval of 125 $\mu$S; k=sampling number 0, 1, 2, 3, . . . ) as indicated in Table 2.

TABLE 2

| Frequency | | Sin Coefficient | Cos Coefficient |
|---|---|---|---|
| $f_1$ | 700 Hz | $\sin \frac{7}{40} \pi \cdot k$ | $\cos \frac{7}{40} \pi \cdot k$ |
| $f_2$ | 900 Hz | $\sin \frac{9}{40} \pi \cdot k$ | $\cos \frac{9}{40} \pi \cdot k$ |
| $f_3$ | 1100 Hz | $\sin \frac{11}{40} \pi \cdot k$ | $\cos \frac{11}{40} \pi \cdot k$ |
| $f_4$ | 1300 Hz | $\sin \frac{13}{40} \pi \cdot k$ | $\cos \frac{13}{40} \pi \cdot k$ |
| $f_5$ | 1500 Hz | $\sin \frac{15}{40} \pi \cdot k$ | $\cos \frac{15}{40} \pi \cdot k$ |
| $f_6$ | 1700 Hz | $\sin \frac{17}{40} \pi \cdot k$ | $\cos \frac{17}{40} \pi \cdot k$ |

TABLE 3

| Sample No. k | m | Coefficient No. j (700 Hz) | |
|---|---|---|---|
| | | sin | cos |
| 0 | 0 | +0 | +20 |
| 1 | 7 | +7 | +13 |
| 2 | 14 | +14 | +6 |
| 3 | 21 | +19 | −1 |
| 4 | 28 | +12 | −8 |
| 5 | 35 | +5 | −15 |
| 6 | 42 | −2 | −18 |
| 7 | 49 | −9 | −11 |
| 8 | 56 | −16 | −4 |
| 9 | 63 | −17 | +3 |
| 10 | 70 | −10 | +10 |
| 11 | 77 | −3 | +17 |
| 12 | 84 | +4 | '16 |
| 13 | 91 | +11 | +9 |
| 14 | 98 | +18 | +2 |
| 15 | 105 | +15 | −5 |
| 16 | 112 | +8 | −12 |
| 17 | 119 | +1 | −19 |
| 18 | 126 | −6 | −14 |
| 19 | 133 | −13 | −7 |
| 20 | 140 | −20 | +0 |
| 21 | 147 | −13 | +7 |
| 22 | 154 | −6 | +14 |
| . | . | . | . |
| . | . | . | . |
| . | . | . | . |
| 39 | 273 | +7 | −13 |
| 40 | 280 | +0 | −20 |

In this table all the angles of trigonometric functions are in the form of (m/40$\pi$).

Figure 15:
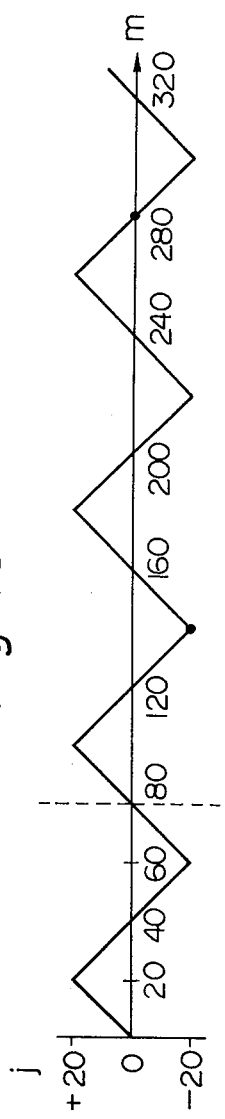
FIG. 15 shows the relationship between the general sample number and the coefficient number.

At this level if the following formulae of trigonometric function are used:

sin ($\theta+2\pi$)=sin $\theta$ sin ($\theta+\pi$)=−sin $\theta$ cos $\theta$=sin ($\theta+\pi/2$)

all the sin coefficients in Table 2 may uniformly turn into the form of sin (j/40$\pi$) (j is an integer being −20 or above and +20 or below), while the function of m and j become such as set our in FIG. 15. That is, in $0 \leq m < 20$, $j = m$, in $20 \leq m < 60$, $j = 40-m$, in $60 \leq m < 80$, $j = m-80$. In $m \geq 80$, 80 as a period this relationship is repeated. Further, with respect to cos coefficient, since $\cos(m/40\pi) = \sin(m+20/40\pi)$ according to the formula, if m, coefficient of sin, is replaced with m+20, the relationship between m and j may be established in the same manner as above.

From the foregoing, the sample number k and coefficient number j will become such as set out in Table 3, in the case of 700 Hz.

In this table, as the sample numbers k become 40 or more, thereafter, it is appropriate that the inversion of polarity of the coefficient numbers at every additional 40 be repeated. This is due to the fact that, referring to FIG. 15, the function form with m on the right side of 280 (matching with k=40) m is the reversal of positive and negative of the form from 0.

A similar development can be performed with respect to the frequencies other than 700 Hz. If the sample numbers k create the coefficient numbers j corresponding to each of the numbers from 0 to 39, relationships between k and j can be established by repeating inversion of polarity for every 40 of a larger k.

Figure 16:
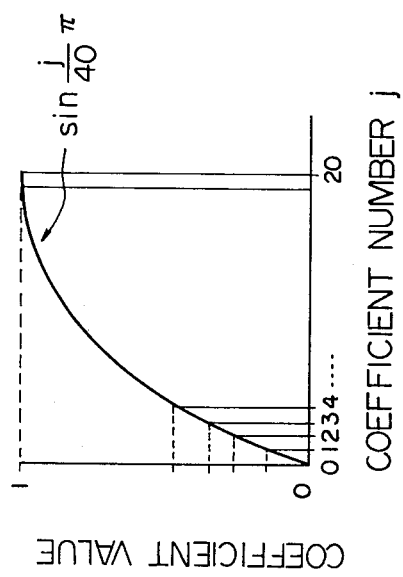
FIG. 16 shows the curve between the coefficient number and the value of the coefficient.

From the foregoing, a total of 41 different types of coefficients, matching with the aforementioned 6 different types of frequencies required for DFT operation, is adequate. Further, positive and negative polarities are specially processed. Thus, the absolute value of coefficients needed is only 21 different types. Relations between the aforementioned coefficient number j and actual coefficient value is depicted in FIG. 16.

Therefore, calculating beforehand the products of the aforementioned 21 different types of coefficients matching with all the samples (64 different types) indicated by 6 bits of input PCM code, these products are encoded in the most convenient code pattern for processing in the later step and are then stored in the memory 224 in the embodiment in FIG. 12. At the time of storing, it should be so arranged that using the coefficient number as segment number, access can be made with the 6 bits of input PCM code to the address within the segment. The required memory capacity is $21 \times 64 = 1,344$ words. It is usually appropriate that the size of each word be about 8 bits although this depends on the required operation precision. Coefficient value of the coefficient number 0 being 0, the result always becomes 0 whatever input PCM code is multiplied. Therefore, without making access to the memory for this coefficient number 0, if a fixed pattern generation circuit that outputs an output code equivalent of 0 is added, the required memory 224 capacity can be reduced to $20 \times 64$ words.

Figure 17:
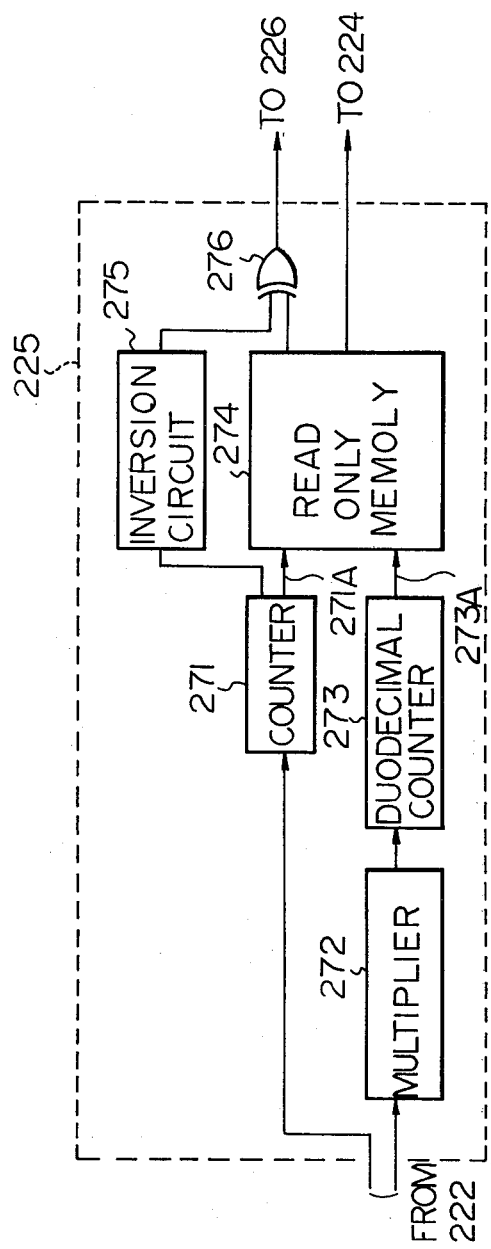
FIG. 17 is the block diagram of the coefficient number generator.
Figure 18:
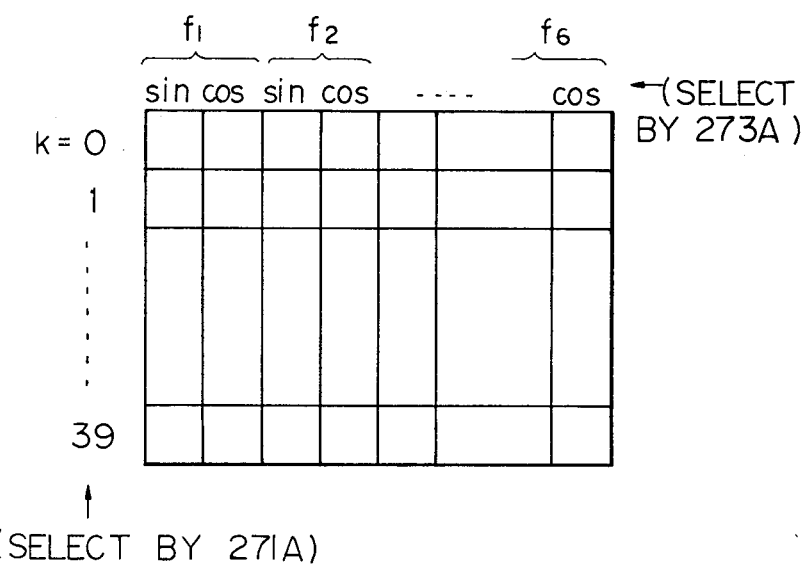
FIG. 18 shows the memory map showing the designation of the memory 274.

The coefficient number generation circuit 225 can be arranged such as illustrated in FIG. 17 which is an example. In FIG. 17, the frame pulse received from the clock terminal 222 is input in the quarantinary counter 271. The channel pulse is input in the multiply circuit 272, and generates timing pulse that divides 1 channel time slot into 12 sub-time slots. 273 is the duodecimal counter and outputs counted value synchronizing with the small time slots. 274 is the specialty read-out memory comprising the $12 \times 40$ word memory. The minimum of 6 bits is sufficient for each word which is for storing the coefficient numbers j. Both the count output 271A of the quarantinary counter 271 and the count output 273A of the duodecimal counter 273 used as address, the memory 274 is accessed. In this memory, the aforementioned coefficient number j is stored. The contents of the address 271A match with the aforementioned sample numbers k, and the 273A is used to identify sine and cosine waves of the 6 different frequencies. Against these addresses, Table 3 as well as a similar table in connection with the frequencies other than 700 Hz are stored in the memory 274 beforehand. The inversion circuit 275 comprises the flip-flop that creates inversion pulse every time the counter 271 exceeds 40. Using this output, only the polarity bit of the codes in the read out contents from the memory 274 is transferred to 226 with the polarity inverted at every 40 frames by the exclusive logical sum circuit 276 (exclusive-or circuit). At the same time, out of the outputs of the memory 274, the components other than the polarity are transferred to 224.

Figure 19:
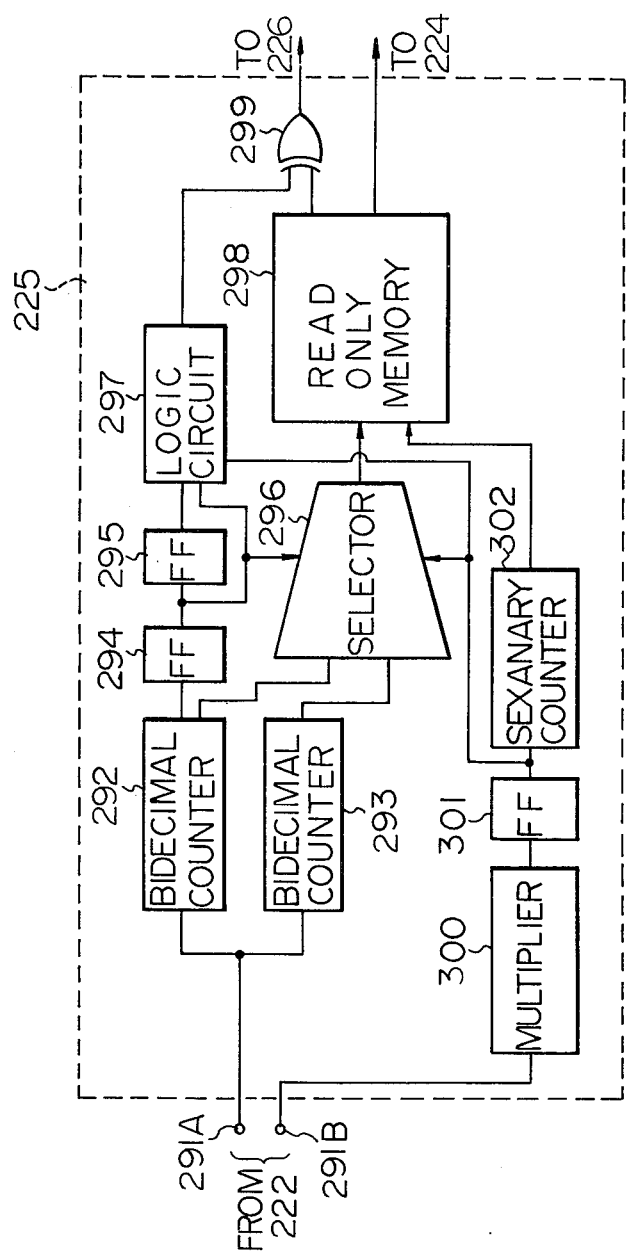
FIG. 19 is the block diagram of the second embodiment of the coefficient number generator.

FIG. 19 illustrates another embodiment of the coefficient number generation circuit 225, where the counter circuit is made slightly more complex. But, instead, the memory volume is reduced. That is, in Table 3, in the sin coefficient column, the k=above 20 and the k=below 19 are symmetrical; the sequence of the cosine coefficients are equal to that of the sine coefficients k except that each sequence is behind the other by 20. Making use of this, the overlapping portion can be eliminated as illustrated in FIG. 20.

In FIG. 20, the ⊙ mark is the starting position and the dotted lines show polarity inversion. As shown in FIG. 20, the storage volume of the memory for purpose of designating coefficient numbers can be reduced to ¼ as compared with the first embodiment by shifting the read out order and the inversion period of polarity through this arrangement of sine coefficient number and cosine coefficient number.

Figure 21:
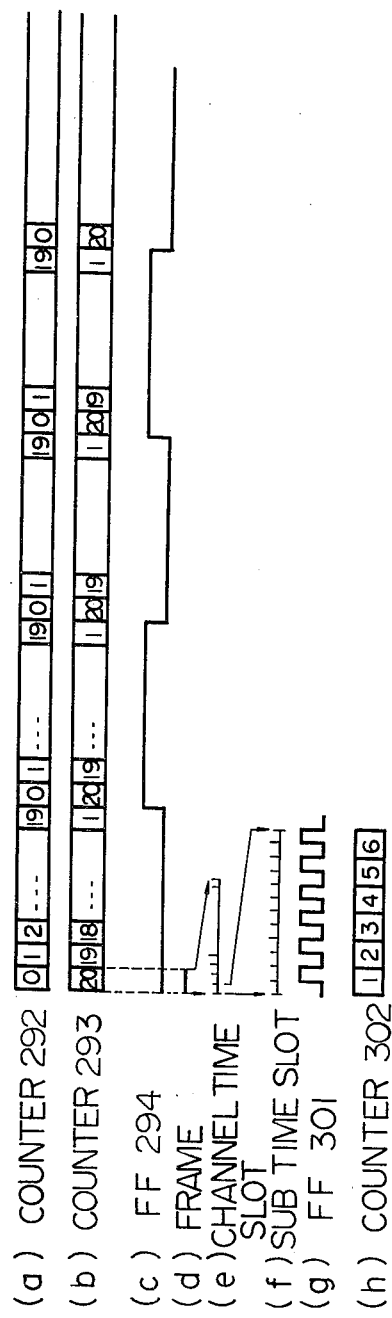

In FIG. 19, the terminal 291A receives the frame pulse and 292 and 293 are the bidecimal counters. The counter 292 is the up-counter whose initial value is 0 and whose count value increases by 1. The counter 293 is the down-counter whose initial value is 20 and whose count value decreases by 1. Both counters return to the initial value when the 20th pulse is counted. 294 and 295 are the 2 step flip-flops that count the cumber of cycles of the counter 293. 296 is the selector that selects either one of the count output values of the two counters, 292 and 293, and supplies it to the memory 298 as part of the address. At the same time, the terminal 291B receives channel pulse; the multiply circuit 300 divides channel time slot into 12 and creates sub-time slot pulse. 301 is the flip-flop and 302 is the hexanary counter. The selector 296 makes a selective output by combination of the output value of the 2 flip-flops (FF) 294 and 301. As indicated in the time chart in FIG. 21, since the FF 294 reverses every 20 frames, and the FF301 (switching sine and cosine) reverses every 1 sub-time slot, when both positions coincide, the numerical value of the counter 292 is output as output from the selector 296. When they do not coincide the numerical value of the counter 293 is output. That is, FF294 is switching either the upper direction or the lower direction of the order of read-out of the table illustrated in FIG. 20, while FF301 is switching sine and cosine. As to the processing of polarity, another flip-flop 295 is placed in the later step of FF294 and the combination of FF294 and FF295 controls the processing. That is, referring to display of the dotted line in FIG. 20, with the third and the fourth large frames (a large frame shall be of 20 units of the frame period) the polarity of the code read out from the memory 298 is inverted with respect to the sine coefficient, while the cosine coefficient is inverted with the first and the fourth large frames. Counts of a large frame can be identified from the output of FF294 and FF295 and further aiding together with the output of FF301 (switching of sine and cosine), polarity inversion instruction is created in the logic circuit 297. The memory 298 is the specialty memory for read-out whereas matching 6 different types of frequencies the value of j' is stored beforehand in the address of k' indicated in Table 4. Selection of address of the frequency position within this memory is performed by the sexanary counter 302 (switching of frequency). Capacity required for this memory is 6×21 words. (At least 6 bits are necessary for each word). The gate 299 is the exclusive-or operation which causes inversion of polarity bit.

As explained above, the memory 224 has been made to store the multiplication table for the absolute value only, excluding polarity, while operation process of polarity is added to the output of the memory 224 separately. However, for practical application of the present invention, separation of polarity for processing is not always necessary. That is, it will be appropriate to make the size of the memory 224 enlarged further and have the multiplication value—which let the input PCM signal and the coefficient number with polarity attached stored in the memory as address of the memory 224—keep the polarity. In this case, various circuits (223, 226, 227) related to processing of polarity in FIG. 12 are not required. However, the capacity of the memory 224 should be made larger.

Therefore, various practicable methods are possible, through the development to be explained below, for arrangement of the multiplication table memory and the coefficient number generation circuit under the present invention.

Figure 22:
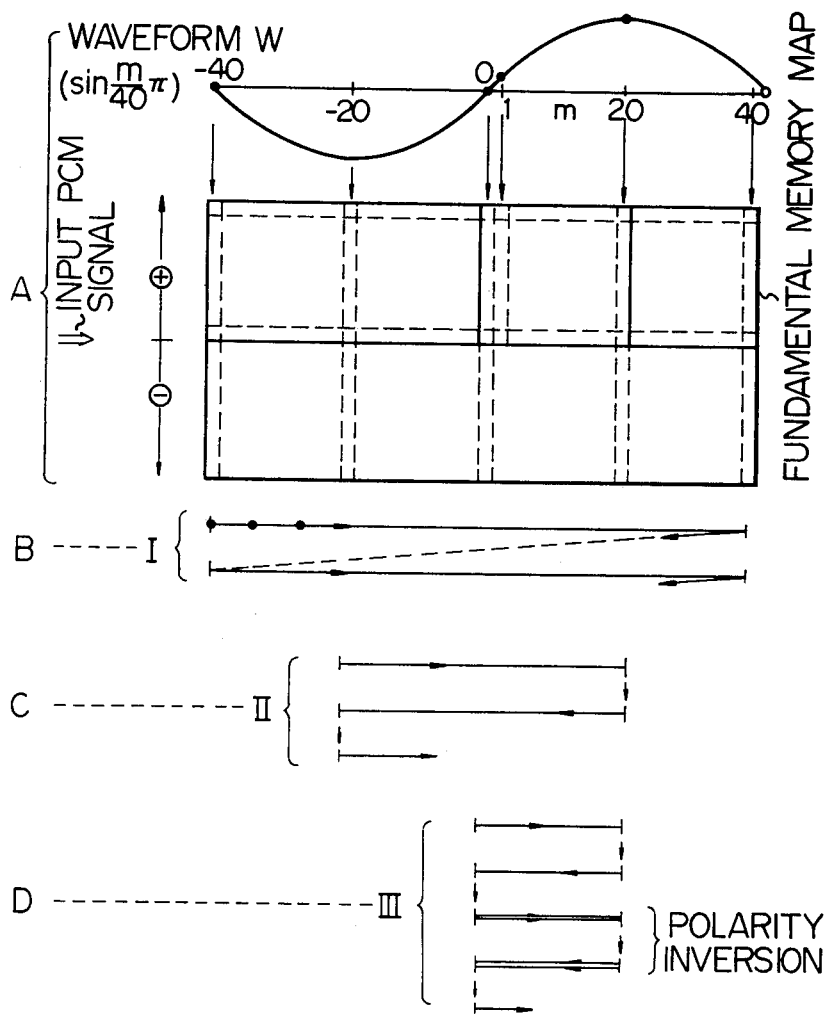

FIG. 22 is a diagram explaining how to create the multiplication memory. In this diagram, the waveform W is to be sine $(m/40)\pi$ (m is an integer). Table look-up of this multiplication table memory is performed by input PCM code and the number (coefficient number) m of the sample of waveform W. At the address position of each, the product of the input value and the sample of the waveform W are stored. Since the waveform W repeats every time m makes 20 changes, it is sufficient to use the $-40-+40$ range illustrated in the diagram. Therefore, the most basic memory map of the present invention is to include positive and negative of input PCM code and the complete scope of the entire cycle of the waveform W. In this case, for operation of 700 Hz for example, cyclic repetition such as shown in I or FIG. 22 is appropriate, causing the coefficient number address m to advance toward increase by 7. If the memory stores the value including polarity, it is not necessary to process polarity of the memory output.

For the reduction of the size of the basic multiplication table memory, there are two ways. These two can be separately or jointly applied. The first method is to separate the polarity of the input PCM code. That is, only the absolute value is used as address of the multiplication table memory and by doing so, the memory size reduces to one half. Then, against the memory output, the operation to multiply polarity at the time of input becomes necessary. (That is, plus input is to remain intact while polarity of minus input is inverted.) The second method is utilization of the characteristic of waveform W which is internally symmetrical. As illustrated in FIG. 22 (II) from $-20$ to $+20$ is used for m. Every time m crosses the $\pm 20$ border the direction is reversed and the address is advanced. The size of the memory, of course, decreases to one half. The second method has another way. As shown in FIG. 22 (III), from 0 to $+20$ is used for m. Every time m crosses the 0 or the $+20$ border the advancement direction is reversed, and at the same time, the polarity of the memory output is inverted every time it makes a turn at 0. In this case, the memory is again reduced to one half.

In the embodiment illustrated in the aforementioned FIG. 22, the first method and the second method (III) are used. It is obvious that other combinations can be readily done.

TABLE 4

| k' | 700 Hz | 900 Hz | 1100 Hz | 1300 Hz | 1500 Hz | 1700 Hz |
|---|---|---|---|---|---|---|
| 0 | +0 | +0 | +0 | +0 | +0 | +0 |
| 1 | +7 | +9 | +11 | +13 | +15 | +17 |
| 2 | +14 | +18 | +18 | +14 | +10 | +6 |
| 3 | +19 | +13 | +7 | +1 | −5 | −11 |
| 4 | +12 | +4 | −4 | −12 | −20 | −12 |
| 5 | +5 | −5 | −15 | −15 | −5 | +5 |
| 6 | −2 | −14 | −14 | −2 | +10 | +18 |
| 7 | −9 | −17 | −3 | +11 | +15 | +1 |
| 8 | −16 | −8 | +8 | +16 | +0 | −16 |
| 9 | −17 | +1 | +19 | +3 | +15 | −7 |
| 10 | −10 | +10 | +10 | −10 | +10 | +10 |
| 11 | −3 | +19 | −1 | −17 | −5 | +13 |
| 12 | +4 | +12 | −12 | −4 | −20 | −4 |
| 13 | +11 | +3 | −17 | +9 | −5 | −19 |
| 14 | +18 | −6 | −6 | +18 | +10 | −2 |
| 15 | +15 | −15 | +5 | +5 | +15 | +15 |
| 16 | +8 | −16 | +16 | −8 | +0 | +8 |
| 17 | +1 | −7 | +13 | −19 | +15 | −9 |
| 18 | −6 | +2 | +2 | −6 | +10 | −14 |
| 19 | −13 | +11 | −9 | +7 | −5 | +3 |
| 20 | −20 | +20 | −20 | +20 | −20 | +20 |

In the aforementioned embodiment, description has been made with 6 reference frequencies ranging from 700 to 1,700 Hz. The present invention, however, is applicable without limiting the frequencies to this range. If frequencies are generalized, they will become as follows:

The sampling interval is assumed to be Ts and reciprocal of N different types of reference frequencies $f_i$ (Hz) or cycle is to be Ti (i=1,2,...N) respectively. The common multiple for Ts and for all the Ti is to be Tc. Then $m_s$ and $m_i$ as integer, the following may be developed.

$$Tc = m_s \times T_s$$

$$Tc = m_i \times T_i$$

The common multiple cycle Tc is divided by $m_s$ units of sampling intervals Ts. This common multiple cycle Tc is equal to $m_i$ units of the reference wave cycle Ti of each. Since the phase for each cycle portion is $2\pi$ radian, if the sampling time interval Ts for common multiple cycle Tc is converted to phase change $$Pc = \frac{Ts}{Tc} \times 2\pi = \frac{2\pi}{m_s}$$

At the same time, the phase change of the sampling interval Ts for reference wave cycle Ti becomes $$P_i = \frac{Ts}{Ti} \times 2\pi = \frac{2\pi}{m_s} \times m_i$$

$$P_i = Pc \times m_i$$

Therefore, it is obvious that for the sample of the reference wave, it is appropriate to use the sample of each and every $m_i$ unit obtained through sampling of sine wave possessing the common multiple cycle Tc. Considering the symmetrical characteristic of sine wave within 1 cycle, as explained in FIG. 22, all of the samples for the entire cycle are not always necessary. It may be one half the cycle or a quarter of a cycle. At the time of application, it will be advantageous if, among the aforementioned common multiples Tc, the least common multiple is used from among many common multiples because $m_s$ can be the least. Furthermore, with respect to the cosine function among reference waves, since it is equal to the sine function with a shift in phase by $\pi/2$, it is appropriate if the sample number is shifted by $m_s/4$ at the time of using the sample of the aforementioned common multiple cycle. However, if $m_s$ is not a multiple of 4, it is appropriate to take a large Tc so that $m_s$ will become multiple of 4. Or alternatively, the cosine wave with a Tc cycle is specially sampled with Ts for use as cosine function and the samples thus obtained may be used at every $m_i$ unit.

Values used in the aforementioned embodiment, in the case of the 6 reference frequencies (700–1,700 Hz) are Ts=1/8000 second. Tc=1/100 second. $m_s$=80. $m_1$=7, $m_2$=9, ..., $m_6$=17.

As explained in detail so far, the present invention attempts to simplify the configuration and provides the benefits of high speed and ready operation through realization of convolution operation with the combination of the read out specialty memory without the use of the multiplicator, where the conventional circuit in practical use needed the most complicated and high speed element for processing input signals and reference trigonometric functions in its convolution operation component. The type of memory used in the present invention is appropriate for large scale integration with simple configuration, high fidelity, and small energy consumption. At the same time, the element is a multipurpose type making the use of mass production type component possible with the resultant low cost. As illustrated in the embodiment, the minimum configuration of the main required memories can be 21×64×8=10,752 bits and 21×6×6=756 bits for the operation of sine wave.cosine wave for 6 frequencies. These can be accommodated in 1 or 2 chips of the memory element of most recently introduced LSI. A cycle time of 326 nano seconds is adequate for time division multiplexing of 32 channels. Therefore, if the present invention is applied to the digital signal processing such as DFT, the resultant effect is obviously great.

From the foregoing it will now be apparent that a new and improved tone signal detecting system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A signal detection system for detecting a particular frequency among a plurality of frequencies, said system comprising an input terminal receiving said plurality of frequencies including the particular frequency, a pair of multipliers for multiplying the input signal and a pair of reference signals which are orthogonal to each other and have the same period as that of the particular frequency, a pair of accumulators for accumulating the outputs of each of said multipliers, a coefficient number generator is provided for generating a plurality of groups of sequence numbers which are synchronized with a sample pulse for sampling the input signal, and said sequence of numbers has the period $M_s$ which is the quotient $T_c/T_s$, where $T_s$ is the duration for sampling the input signal and $T_c$ is the common multiple of said $T_s$ and the period $T_i$ of each reference frequency signal, and is incremented or decremented by the step of $M_1$ which is the quotient $T_c/T_i$, a pair of square circuits for squaring the output of each said accumulators, an adder for summing the outputs of said square circuits; a decision circuit for comparing the output of said adder with a predetermined threshold value and detecting the particular frequency when the output of the adder is larger than the predetermined threshold value, and an output terminal connected to the output of said decision circuit for providing an output when said decision circuit detects the particular frequency, wherein said multiplier has a memory which stores the product of the sampled level of the input signal and the sampled level of the reference signal at an address which is defined by said sampled level of the input signal, and wherein the multiplication is performed by looking up in said memory according to the sampled level, the sequence of the input signal and the coefficient number of the reference signal, said memory storing the product of the sampled value of the input signal and the coefficient value which is obtained by sampling the reference signal in every sampling duration $T_s$ at the address which is determined by the code of the sampled value of the input signal and the sequence number of said coefficient value, and said memory providing a product every time an input signal is applied to the memory from the address defined by the sampled value of the input signal and the coefficient value obtained from said coefficient number generator.

2. A signal detection system according to claim 1, wherein said common multiple is the least common multiple of $T_s$ and each $T_i$.

3. A signal detection system according to claim 1, wherein the output of said coefficient number generator is incremented by $M_i$ in the former half of the period $M_s$, and is decremented by $M_i$ in the latter half of the period $M_s$, and said memory stores the product only for the half period of the common multiple $T_c$.

4. A signal detection system according to claim 1, wherein the output of said coefficient number generator is incremented by $M_i$ in the first and the third quadrant period $M_s$, and is decremented by $M_i$ in the second and the fourth quadrant period $M_s$, and said coefficient number generator provides the sign inversing signal in the third and the fourth quadrant period, and wherein said memory stores the product only for the quarter of the common multiple $T_c$, and the sign of the output of the memory is inversed when said generator provides the sign inversing signal.

5. A signal detection system according to claim 1, wherein said memory stores only the absolute value of the product, and wherein a sign separation circuit is provided for separating the sign of the input signal and providing only the absolute value of the input signal to the memory at the input side of the memory, and a sign combining circuit is provided at the output side of the memory for attaching the sign from said sign separating circuit to the output of said memory.

6. A signal detection system according to claim 1 wherein when the reference signal includes a sine wave signal and a cosine wave signal having the same period as that of the sine wave signal, said coefficient number generator generates a pair of outputs for each coefficient number so that the difference between the outputs for each coefficient number is $M_s/4$.

* * * * *